United States Patent
Lin et al.

(10) Patent No.: US 9,335,374 B2
(45) Date of Patent: May 10, 2016

(54) DYNAMIC SHIFT FOR TEST PATTERN COMPRESSION

(71) Applicant: Mentor Graphics Corporation, Wilsonville, OR (US)

(72) Inventors: Xijiang Lin, West Linn, OR (US); Mark A. Kassab, Wilsonville, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/557,739

(22) Filed: Dec. 2, 2014

(65) Prior Publication Data

US 2015/0153410 A1 Jun. 4, 2015

Related U.S. Application Data

(60) Provisional application No. 61/910,741, filed on Dec. 2, 2013.

(51) Int. Cl.
*G01R 31/3185* (2006.01)

(52) U.S. Cl.
CPC *G01R 31/318536* (2013.01); *G01R 31/318547* (2013.01)

(58) Field of Classification Search
CPC ............ G01R 31/318307; G01R 31/318335; G01R 31/318536; G01R 31/318547; G01R 31/31727
USPC ....................................................... 714/731
See application file for complete search history.

(56) References Cited

U.S. PATENT DOCUMENTS

| | | | | |
|---|---|---|---|---|
| 6,684,358 | B1 * | 1/2004 | Rajski et al. | 714/739 |
| 7,188,286 | B2 * | 3/2007 | Dervisoglu et al. | 714/727 |
| 7,237,162 | B1 * | 6/2007 | Wohl et al. | 714/726 |
| 7,669,154 | B2 * | 2/2010 | Hosono | 716/135 |

OTHER PUBLICATIONS

Chandra, A.; Kapur, R., "Not All Xs are Bad for Scan Compression," Asian Test Symposium, 2008. ATS '08. 17th, vol., no., pp. 7,12, Nov. 24-27, 2008.*
Zhanglei Wang; Chakrabarty, K., "Test data compression for IP embedded cores using selective encoding of scan slices," Test Conference, 2005. Proceedings. ITC 2005. IEEE International , vol., no., pp. 10 pp. 590, Nov. 8-8, 2005.*
B. Koenemann, "LFSR-Coded Test Patterns for Scan Design," in Proc. European Test Conf., 1991, pp. 237-242.
S. Samaranayake et al., "A Reconfigurable Shared Scan-in Architecture," in Proc. VLSI Test Symp., 2003, pp. 9-14.
L.-T. Wang, "VirtualScan: A New Compressed Scan Technology for Test Cost Reduction, "in Proc. ITC, 2004, pp. 916-925.
B. Keller et al., "OPMISR: The Foundation for Compressed ATPG Vector," in Proc. Intl. Test Conf., 2001, pp. 748-757.
S. Mitra and K.S. Kim, "XPAND: An Efficient Test Stimulus Compression Technique," in IEEE Trans. on comp., vol. 55, No. 2, Feb. 2006, pp. 163-173.

(Continued)

*Primary Examiner* — Cynthia Britt

(57) ABSTRACT

Various aspects of the disclosed techniques relate to using dynamic shift for test pattern compression. Scan chains are divided into segments. Non-shift clock cycles are added to one or more segments to make an uncompressible test pattern compressible. The one or more segments may be selected based on compressibility, the number of specified bits and/or the location on the scan chains. A dynamic shift controller may be employed to control the dynamic shift.

16 Claims, 13 Drawing Sheets

Flow chart 600

(56) References Cited

OTHER PUBLICATIONS

P. Wohl et al., "Efficient Compression of Deterministic Patterns into Multiple PRPG Seeds," in Proc. ITC., 2005, paper 36.1.
S. Hellebrand et al., "Build-in Test for Circuits with Scan Based on Reseeding of Multiple-Polynomial Linear Feedback Shift Register," in IEEE Trans. Comp., vol. C-44, Feb. 1995, pp. 223-233.
C.V. Krishna and N.A. Touba, "Reducing Test Data Volumn Using LFSR Reseeding with Seed Compression," in Intl. Test Conf., 2003, pp. 321-330.
B. Koenemann et al., "A SmartBIST Variant with Guaranteed Encoding," in Proc. ATS, 2001, pp. 325-330.
J. Rajski, et al., "Embedded Deterministic Test," in Trans. on CAD, vol. 23, May 2004, pp. 776-792.
J. Janicki, et al., "EDT Bandwidth Management in Soc Design," in IEEE Tran. on CAD, vol. 31, No. 2, Dec. 2012, pp. 1894-1907.
G. Li, J. Qian, P. Li, and G. Zuo, "Multi-Level EDT to Reduce Scan Channels in Soc Designs," in Proc. ATS, 2012, pp. 77-82.

* cited by examiner

| Shift | ST₁ | ST₂ |
|---|---|---|
| Init 1 | 0 | 0 |
| Init 2 | X₁ | 0 |
| Shift 1 | X₁+X₂ | X₁ |
| Shift 2 | X₂+X₃ | X₂ |
| Shift 3 | X₁+X₃+X₄ | X₃ |
| Shift 4 | X₂+X₄+X₅ | X₁+X₄ |

FIG. 4B

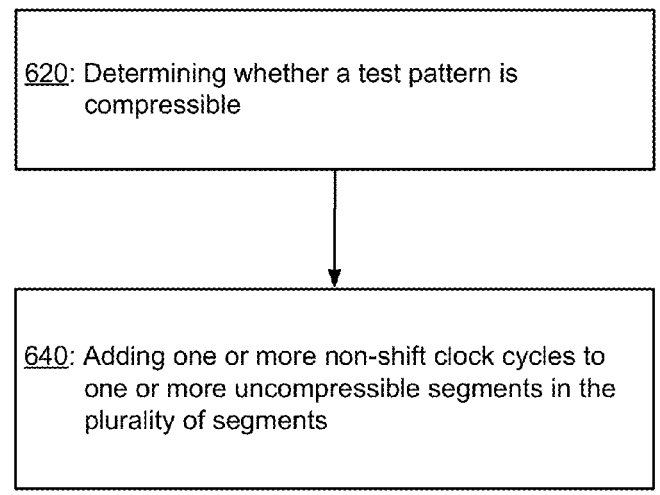
Flow chart
600
FIG. 6

Procedure: *TG_with_dynamic_shift* (*F, S, A, N*)

// *F*: The set of faults to be targeted.

// *S*: The number of segments the scan chains are divided into.

//*M*: Maximum number of segments with additional cycles.

// *N*: Number of additional cycles added to each shift cycle.

1. Set the generated test set *T*=.
2. Mark every fault in *F* as untargeted.
3. While not all the faults in *F* are marked as untargeted, do:
   (1) Pick an untargeted fault *f* from *F* and mark *f* as targeted.
   (2) Generate a test cube *tc* to detect *f*.
   (3) If *f* is untestable, remove it from *F* and go to Step 3.
   (4) If *f* is abort, go to Step 3.
   (5) Initialize array {*E*[*i*]=false: *i*=1 to *S*}. If *E*[*i*] is set to true later, it means additional *N* shift cycles are added at beginning of every shift cycle in the $i^{th}$ segment.
   (6) If *compress_test_cube*(*tc, S, M, N, E*) returns false, go to Step 3.
   (7) While dynamic compaction effort is not reached, do:
   (a) Pick next secondary target fault $f_s$ from *F*.
   (b) Try to specify additional bits in *tc* to detect $f_s$.
   (c) If $f_s$ is not detected, increase the spent dynamic compaction effort and go to Step 3(7).
   (d) Let the new test cube be *tc'*. If *compress_test_cube*(*tc', S, M, N,* E) returns false, go to Step 3(7).
   (e) Replace *tc* by *tc'*.
   (8) Add *t* to *T* and fault simulate the faults in *F* to drop the faults detected by *t*.

FIG. 8A

Procedure *compress_test_cube (tc, S, M, N, E)*

1. Call solver to compress *tc* by taking additional cycles including in the segments with $E[i]$=true into account.
2. If *t* is compressible, return true.
3. Let the number of segments with $E[i]$=true be *e*. If *e* is not less than *M*, return false. Otherwise, set *m=M-e*.
4. Count the number of specified bits in each segment with $E[i]$=false and order these segments in decreasing order of the number of specified bits. Let the ordered list be *OS*.
5. If *OS* is empty, return false.
6. For each segment in *OS*, call solver to compress the specified bits in the segment only in order to identify the segments that cannot be compressed.
7. If there is no uncompressible segment in *OS*, keep the first *m* segments in *OS* and remove the others. Next, return *compress_test_cube_by_adding_cycles(tc, N, E, OS)*.
8. If the number of uncompressible segments in *OS* is greater than *m*, return false.
9. Remove the uncompressible segments from *OS* and include them in the uncompressible segment set *US*.
10. Order the segments in *US* according to the increasing order of their location related to scan outputs.
11. If *compress_test_cube_by_adding_cycles(tc, N, E, US)* returns true, return true.
12. If $(|US|+e)$ is not less than M, return false.
13. Copy *E* to *E'* and set $E'[i]$=true if $i^{th}$ segment *US*.
14. Remove all segments except the first *(M-|US|-e)* segments from *OS*.
15. If *compress_test_cube_by_adding_cycles(tc, N, E', OS)* returns false, return false.
16. Copy *E'* to *E* and return true.

FIG. 8B

Procedure *compress_test_cube_by_adding_cycles(tc, N, E, OS)*
// *OS*: the set of segment candidates for adding cycles
1. Copy *E* to *E'*.
2. For *i*=1 to $|OS|$, do:
   (1) Set $E'[OS[i]]$=true.
   (2) Call solver to compress *tc* by taking additional cycles including in the segments with $E[i]$=true into account.
   (3) If *tc* is compressible, copy *E'* to *E* and return true.
3. Return false.

FIG. 8C

DYNAMIC SHIFT FOR TEST PATTERN COMPRESSION

RELATED APPLICATIONS

This application claims the benefit of U.S. Provisional Patent Application No. 61/910,741, filed on Dec. 2, 2013, and naming Xijiang Lin et al. as inventors, which application is incorporated entirely herein by reference.

FIELD OF THE DISCLOSED TECHNIQUES

The presently disclosed techniques relates to the field of circuit testing technology. Various implementations of the disclosed techniques may be particularly useful for testing circuits with high test data compression.

BACKGROUND OF THE DISCLOSED TECHNIQUES

As integrated circuit feature size continues to shrink, more functional blocks are integrated in a single chip. Meanwhile, complex fault models are often required to detect the defects emerged from the shrinking technologies and new materials. It in turn causes dramatic increase of test data volume and test application time. On-chip test compression has become a standard DFT methodology in industry today.

In the past decades, a large number of test compression schemes have been proposed. They can be classified into three categories, stand-alone BIST, hybrid BIST, and test data compression. The original idea of test data compression approach, known as LFSR-coding, exploits the fact that the number of specified bits in the test cubes is typically no more than 1% of total number of scan cells in the design and the test data compression is achieved by encoding the specified bits as a LFSR seed. During test, the seed is decompressed by an on-chip LFSR (Linear Finite State Register). The same fact is utilized by the following test data compression schemes to reduce test data volume.

Depending on the implementation of the decompressing hardware, the schemes for test stimulus compression include code-based schemes, broadcast-based schemes, linear-decompressor based schemes, etc. The linear-decompressor based schemes typically achieve better encoding efficiency than the other two types of schemes. The function of the linear-decompressor can be described by a linear Boolean equation $AX=Y$, where A is a characteristic matrix, X represents compressed test stimuli supplied from the tester, and Y represents uncompressed test stimuli shifted into scan chains.

The combinational linear decompressor implements the characteristic matrix by using an XOR network, of which the encoding capability at a shift cycle is restricted to the number of inputs of the XOR network. The sequential linear decompressor inserts a linear finite-state machine such as LFSR, or ring generator between the decompressor inputs and the XOR network. It improves the encoding capability by utilizing the compressed test stimuli shifted-in at both current and previous cycles to encode the test stimulus needed at the current shift cycle. In static reseeding approaches, the specified bits in a test cube are encoded by using LFSR seed and the LFSR size has to be no less than the number of specific bits in the test cube. Through injecting the compressed test stimuli continuously during shift, the dynamic reseeding approaches increase the encoding capability significantly while allowing the use of the LFSR with a smaller size.

As the number of cores integrated in a system-on-chip circuit design increases, the number of top level pins is far less than the requirements to test a large number of cores in parallel. To reduce the test application time, the efficiency of utilizing limited tester bandwidth must be improved. The specified bits in the test cubes generated by dynamic compaction have been found to be non-uniform distributed. The tester bandwidth can thus be reduced through dynamic allocation of the input channels feeding to different cores in the system-on-chip circuit design. To support this scheme, de-multiplexers are inserted between top level channel inputs and core inputs that allow dynamic configuration of the channel inputs feeding to each core. In a paper by J. Janicki, et al., entitled "EDT Bandwidth Management in Soc Design," in IEEE Tran. on CAD, vol. 31, no. 2, December 2012, pp. 1894-1907, the control data for de-multiplexers are supplied in pattern based manner and uploaded through the same channel inputs to provide compressed test patterns. In another paper by G. Li, et al., entitled "Multi-Level EDT to Reduce Scan Channels in Soc Designs," in Proc. ATS, 2012, pp. 77-82A, a cycle-based method was proposed to allocate the channel inputs. Although the method proposed by G. Li, et al. provides more flexibility than J. Janicki, et al., dedicated control signals must be added for each core to control the configuration of the channel inputs, making it not scale up well for a circuit design with a large number of cores.

One way to improve the tester bandwidth without dynamically allocating the channel inputs is to reduce the number of channels used by each core. Testing each core in extremely high compression environment allows more cores to be tested in parallel. Unfortunately, reducing the number of channel inputs feeding to a core implies lower encoding capacity. As a result, testable faults may become undetected due to the lack of encoding capacity. More test patterns are often needed to achieve the same test coverage since less number of faults can be detected by each test cube during dynamic compaction.

BRIEF SUMMARY OF THE DISCLOSED TECHNIQUES

Various aspects of the disclosed techniques relate to techniques for generating compressed test patterns based on dynamic shift. In one aspect, there is a method, executed by at least one processor of a computer, comprising: generating compressed test patterns for a design of an integrated circuit, wherein the integrated circuit comprises: a decompressor configurable to decompress the compressed test patterns, a compactor configurable to compact test response data, and scan chains coupled to outputs of the decompressor and to inputs of the compactor, each of scan chains in the circuit design being divided into a plurality of segments, and wherein the generating comprises: adding, when necessary for deriving the compressed test patterns, one or more non-shift clock cycles to one or more segments in the plurality of segments, the one or more non-shift clock cycles being additional clock cycles that the decompressor uses to generate bits for scan cells in the one or more segments of the scan chains; and storing the compressed test patterns and information related to the added one or more non-shift clock cycles.

The decompressor may be a linear finite-state machine. The one or more segments may be selected from the plurality of segments based on whether a segment is compressible. The adding may comprise: determining numbers of specified bits for the plurality of segments, and the selecting of the one or more segments from the plurality of segments may further be based on the numbers of specified bits. The one or more segments may be selected from the plurality of segments based still further on segment locations on the scan chains.

The adding may comprises: determining whether test compression is achievable; and if the test compression is unachievable, adding a predetermined number of non-shift clock cycles to bits of the test patterns associated with one segment in the plurality of segments. The adding may further comprise: determining whether the test compression is achievable after the predetermined number of non-shift clock cycles are added to bits of the test patterns associated with the one segment in the plurality of segments; and if the test compression is unachievable, adding the predetermined number of non-shift clock cycles to bits of the test patterns associated with another segment in the plurality of segments.

In another aspect, there are one or more non-transitory computer-readable media storing computer-executable instructions for causing one or more processors to perform a method, the method comprising: generating compressed test patterns for a design of an integrated circuit, wherein the integrated circuit comprises: a decompressor configurable to decompress the compressed test patterns, a compactor configurable to compact test response data, and scan chains coupled to outputs of the decompressor and to inputs of the compactor, each of scan chains in the circuit design being divided into a plurality of segments, and wherein the generating comprises: adding, when necessary for deriving the compressed test patterns, one or more non-shift clock cycles to one or more segments in the plurality of segments, the one or more non-shift clock cycles being additional clock cycles that the decompressor uses to generate bits for scan cells in the one or more segments of the scan chains; and storing the compressed test patterns and information related to the added one or more non-shift clock cycles.

In still another aspect, there is an integrated circuit, comprising: a plurality of circuit blocks, wherein each of the plurality of circuit blocks comprises: a decompressor configurable to decompress compressed test patterns; a compactor configurable to compact test response data; scan chains coupled to outputs of the decompressor and to inputs of the compactor, wherein the scan chains are divided into a plurality of segments; and circuitry configured to add one or more non-shift clock cycles to one or more segments in the plurality of segments based on non-shift clock control data, wherein the one or more non-shift clock cycles are additional clock cycles the decompressor uses to generate bits to scan cells in the one or more segments of the scan chains.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIGS. 4A-4C use an example to illustrate how adding non-shift clock cycles can make an uncompressible test cube compressible: FIG. 4A illustrates a test circuit for detecting a stuck-at-0 fault at the output of a three-input AND gate; FIG. 4B illustrates a table of linear equations for encoding (compressing) test patterns; and FIG. 4C illustrates a table of linear equations for encoding (compressing) test patterns with a non-shift clock cycle being added and the corresponding clock waveforms.

FIG. 6 a flowchart showing a process for generating compressed test patterns based on dynamic shift that may be implemented according to various examples of the disclosed technology.

FIGS. 8A-8C shows an example of a detailed implementation of the flow chart 600.

DETAILED DESCRIPTION OF THE DISCLOSED TECHNIQUES

Figure 1:
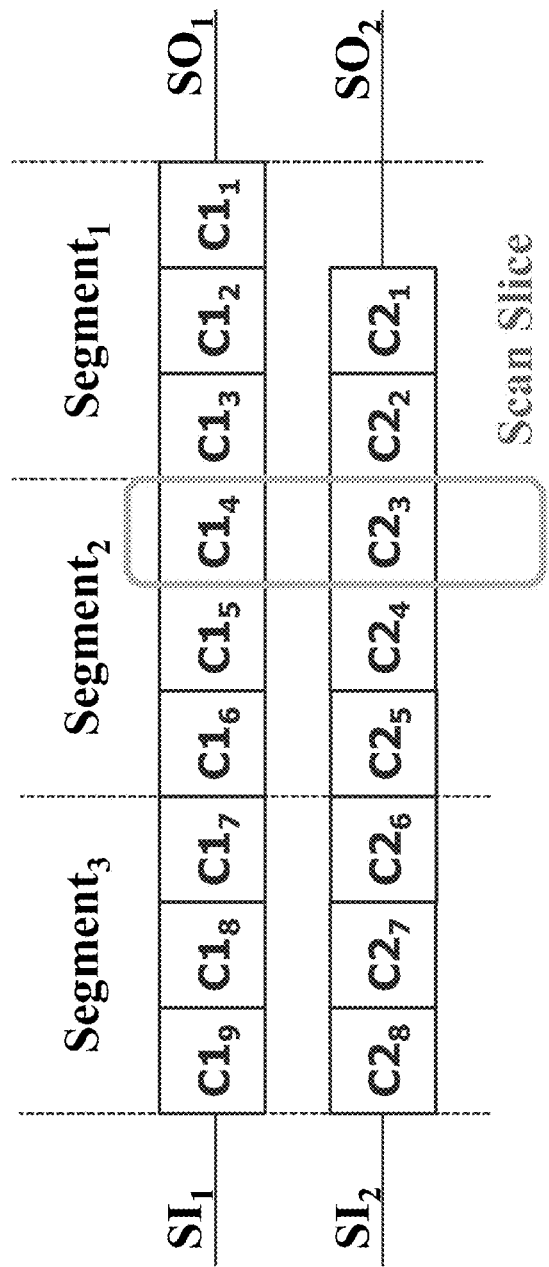
FIG. 1 illustrates an example of the scan chains in the industrial design being divided into multiple segments.

Various aspects of the disclosed techniques relate to techniques for generating compressed test patterns based on dynamic shift. In the following description, numerous details are set forth for the purpose of explanation. However, one of ordinary skill in the art will realize that the disclosed techniques may be practiced without the use of these specific details. In other instances, well-known features have not been described in details to avoid obscuring the presently disclosed techniques.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "generate" and "add" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The test cube properties have been studied extensively in the past. Various test compression schemes are based on one important test cube property: a test cube generated by a test generator usually contains only a small percentage of specified bits. The sequential linear decompressor based scheme, embedded deterministic test (EDT) is used as an example to describe the disclosed techniques. It should be appreciated, however, that the disclosed techniques can be applied to different test compression schemes.

In conventional EDT, the tester supplies the compressed test patterns to the on-chip decompressor through one or more channel inputs and the number of shift cycles to load the test stimuli of a test pattern is equal to the sum of the leading initialization cycles with the fixed size and the number of scan cells in the longest scan chain. The initialization cycles are used to initialize the decompressor to an appropriate state before starting to feed the uncompressed test stimuli to the internal scan cells. As a result, the number of free variables that can be used to compress the specified bits is bounded by the number of shift cycles times the number of channel inputs. Additional details concerning EDT-based compression and decompression are found in J. Rajski, J. Tyszer, M. Kassab, and N. Mukherjee, "Embedded deterministic test," *IEEE Trans. CAD*, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, all of which are hereby incorporated herein by reference.

The number of specified bits in the test cubes generated by deterministic test generator drops quickly to less than 1% of the total number of scan cells after several hundreds of test patterns. Only 0.2% of scan cells on average are specified in a generated test cube set. This observation leads to use multiple channel input configurations to reduce test data volume as well as to avoid underutilization of the ATE interface bandwidth that causes low encoding efficiency.

When the number of channel inputs becomes smaller, a test cube can become uncompressible. An experiment to study which portion of specified bits in the test cube causes it become uncompressible is conducted on an industrial design comprising 1.72M gates and 127K scan cells that are stitched on 524 scan chains. A broad-side transition test set, including 62784 test cubes, is first generated for EDT with 4 channel inputs. Dynamic compaction is applied when generating the test cube set. When the EDT is set with 2 channel inputs, 52419 out of 62784 test cubes become uncompressible.

FIG. 1 illustrates an example of the scan chains in the industrial design being divided into multiple segments. In this example, all of the scan chains are left aligned along the scan chain inputs. Each column is called a scan slice. The adjacent scan slices are grouped into multiple segments with the same length starting from scan inputs to scan outputs. The two scan chains shown in the figure have different length and are divided into three segments. In the experiment, the scan chains are divided into 8 segments and each segment includes 33 scan cells. As a result, 132 and 66 free variables per segment can be supplied from the 4 and 2 channel inputs, respectively. After counting the segments with specified bits in each test cube, it is found 7.99 segments have specified bits on average among all uncompressible test cubes.

Figure 2:
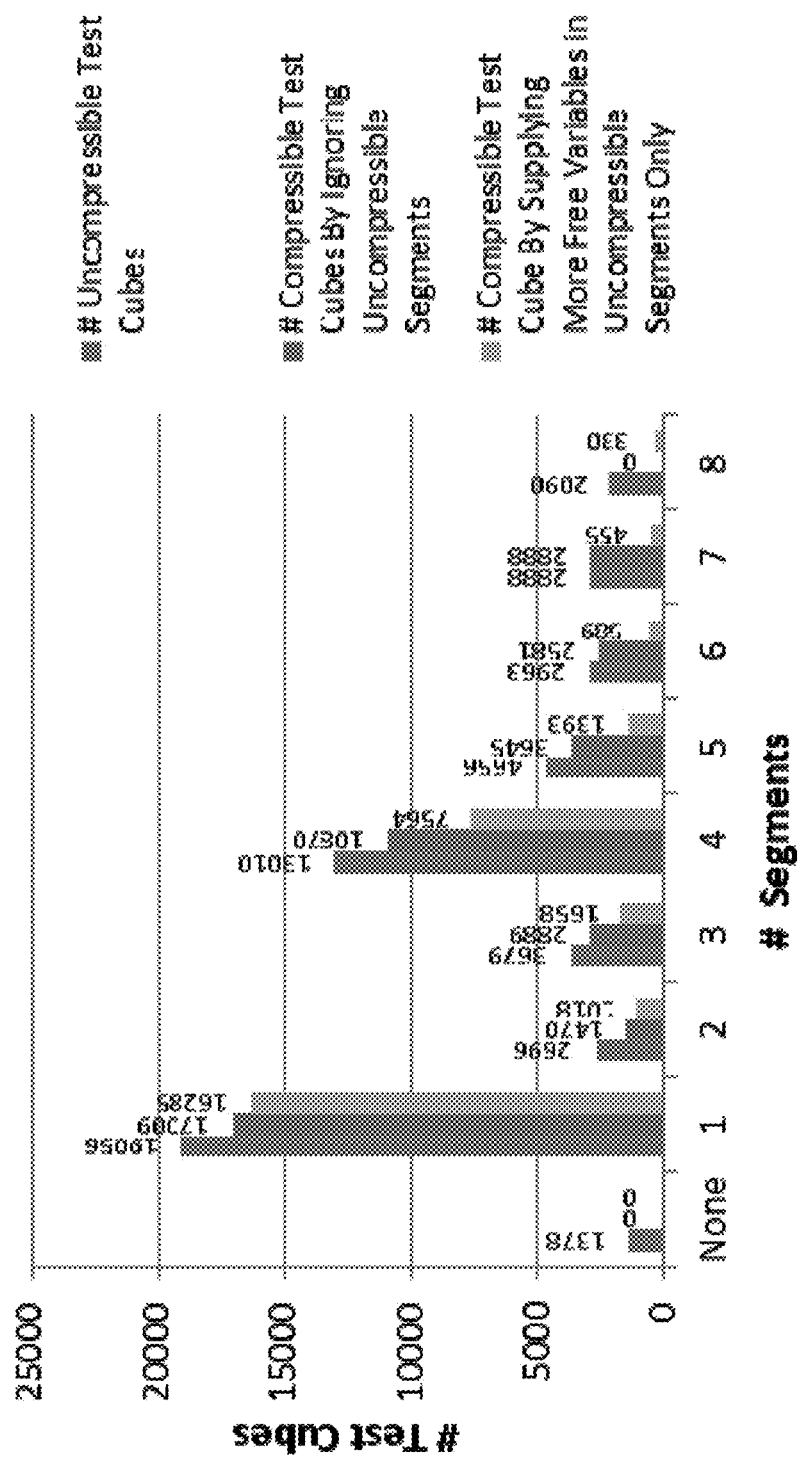
FIG. 2 illustrates an example of a distribution of the number of uncompressible test cubes vs. the number of the uncompressible test cubes becoming compressible after removing the specified bits vs. the number of the uncompressible test cubes becoming compressible after adding non-shift clock cycles.

For every uncompressible test cube, the compression of specified bits in each segment alone for the EDT with 2 channel inputs is determined. If a segment is uncompressible, the original test cube is uncompressible too. In FIG. 2, the number of uncompressible test cubes for each of the segments is shown by blue bars. "None" means no uncompressible segment is found in the test cube. The majority of uncompressible test cubes have no more than 4 uncompressible segments. After removing all the specified bits in the uncompressible segments, the distribution of the number of test cubes becoming compressible is shown by red bars and 78.9% of the uncompressible test cubes (41352 in total) become compressible.

Figure 3:
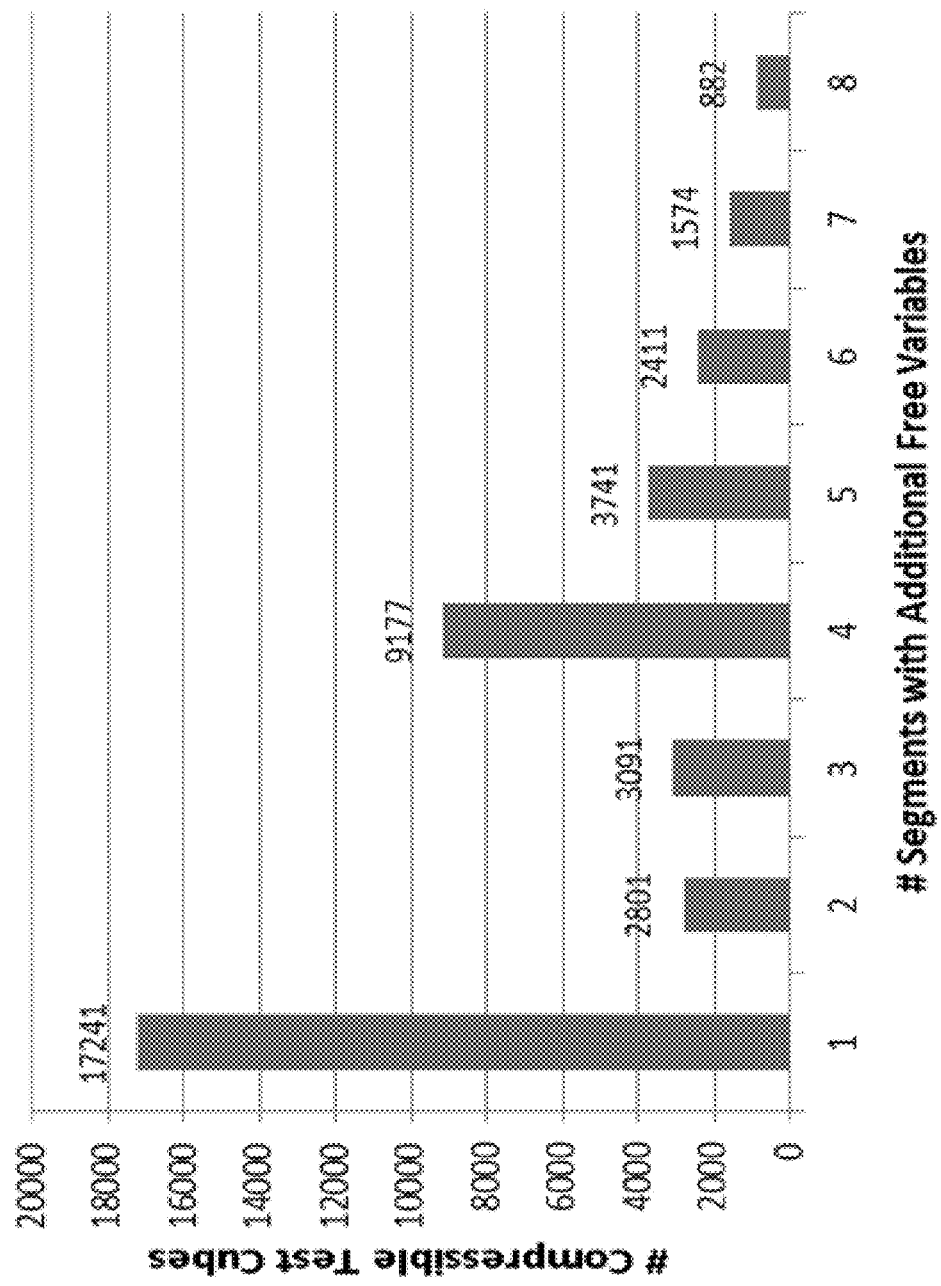
FIG. 3 illustrates the distribution of the compressible test cubes requiring additional free variables for the example shown in FIG. 2.

To make the uncompressible segments compressible while keeping the number of channel inputs as 2, the linear equation solver for EDT is modified by doubling the free variables. For example, if a test cube has two uncompressible segments at the segments 1 and 5, we add extra 66 free variables in each segment when compressing all the specified bits in the original test cube. The details will be discussed below. The number of test cubes becoming compressible is shown by green bars in FIG. 2. 55.9% of uncompressible test cubes or 29292 test cubes become compressible. After allowing as many segments as necessary to double the free variables, the number of compressible test cubes becomes 40918, i.e., 78% of uncompressible test cubes and the distribution of the compressible test cubes requiring additional free variables is shown in FIG. 3. For example, 17241 uncompressible test cubes become compressible after doubling free variables only in one segment. The experimental results shows supplying additional free variables locally helps to make uncompressible test cubes become compressible without increasing the number of channel inputs.

Figure 4A:
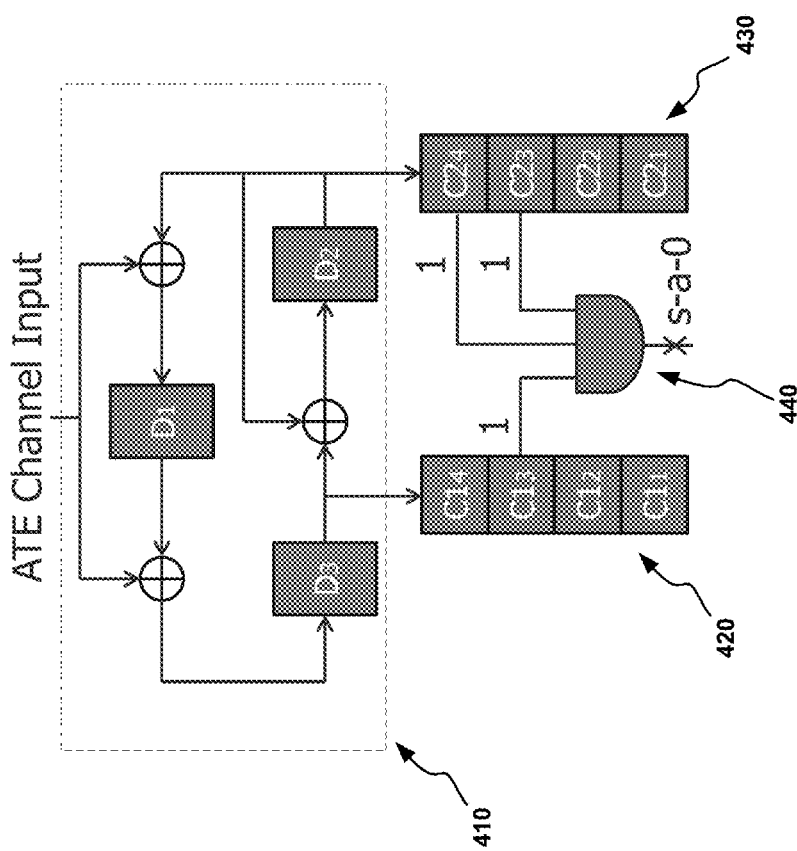
Figure 4C:
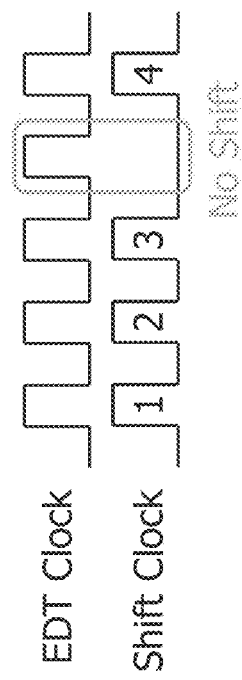

Adding free variables is equivalent to adding non-shift clock cycles. FIGS. 4A-C use an example to illustrate how adding non-shift clock cycles can make an uncompressible test cube compressible. FIG. 4A illustrates a test circuit for detecting a stuck-at-0 fault at the output of a three-input AND gate. A linear-feedback shift register 410 decompresses compressed test patterns delivered from ATE. Uncompressed test patterns are shifted into scan chains 420 and 430. The parallel outputs of scan cells $C1_3$, $C2_4$ and $C2_3$ are coupled to the three inputs of the AND gate 440. To detect the stuck-at-0 fault, the value of "1" need to be shifted into to $C1_3$, $C2_4$ and $C2_3$.

FIG. 4B illustrates a table of linear equations for the linear-feedback shift register 410 for encoding (compressing) test patterns. "Init 1" and "Init 2" correspond to clock cycles for initializing the decompressor 410 to an appropriate state. "Shift 1", "Shift 2", "Shift 3" and "Shift 4" correspond to clock cycles for loading bits to scan cells $C1_1/C2_1$, $C1_2/C2_2$, $C1_3/C2_3$ and $C1_4/C2_4$, respectively. To detect the stuck-at-0 fault, these three equations must be solvable: $X_1+X_3+X_4=1$, $X_1+X_4=1$, and $X_3=1$. Obviously, no solution exists as both $X_3=0$ and $X_3=1$ must be true at the same time.

FIG. 4C illustrates a table of linear equations for the linear-feedback shift register 410 for encoding (compressing) test patterns with a non-shift clock cycle being added and the corresponding clock waveforms. The non-shift clock cycle is added before the bits for $C1_4/C2_4$ are shifted in. The equation set is now solvable: $X_1+X_3+X_4=1$, $X_3=1$, and $X_1+X_2+X_5=1$. One solution is: $X_1=0$, $X_2=0$, $X_3=1$, $X_4=0$, $X_5=1$. This demonstrates adding non-shift clock cycles can make an uncompressible test cube compressible.

Figure 5:
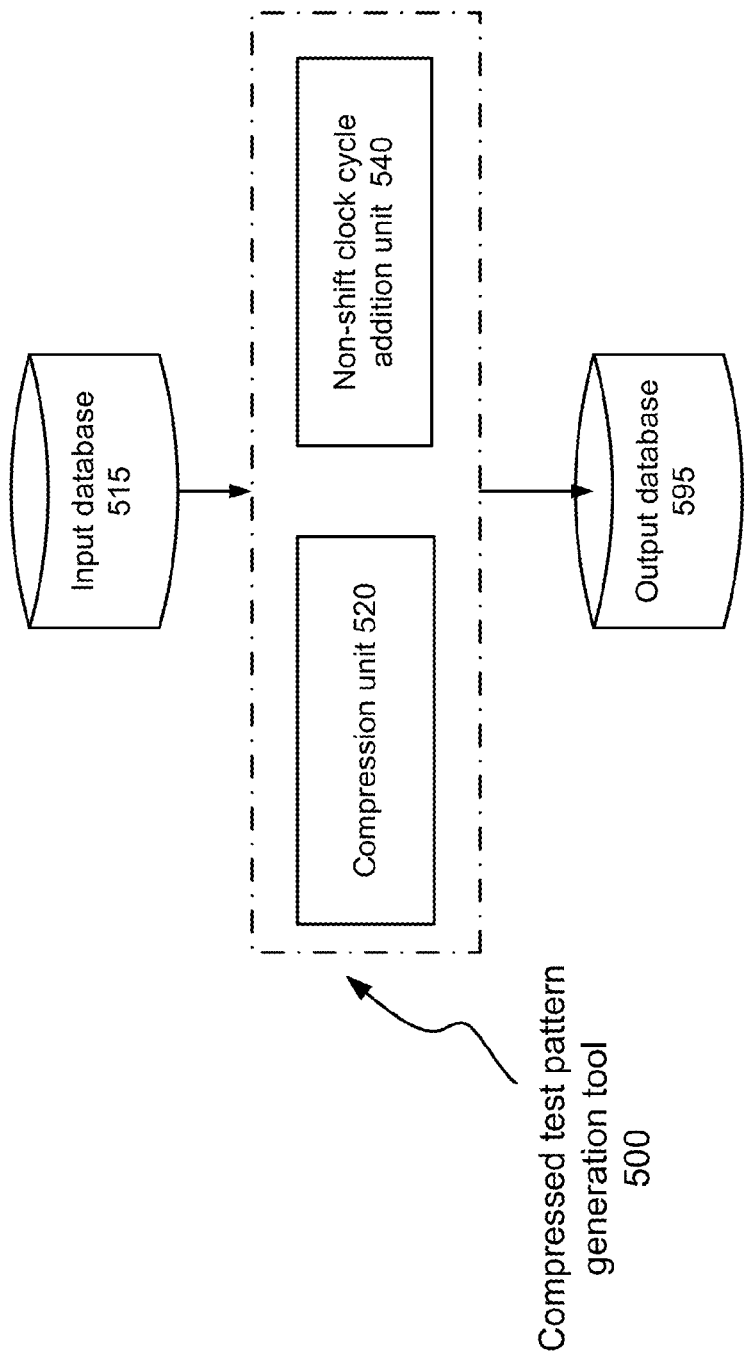
FIG. 5 illustrates an example of a compressed test pattern generation tool according to various embodiments of the disclosed technology.

FIG. 5 illustrates an example of a compressed test pattern generation tool according to various embodiments of the disclosed technology. As seen in the figure, the compressed test pattern generation tool 500 comprises two units: a compression unit 520 and a non-shift clock cycle addition unit 540. Some implementations of the compressed test pattern generation tool 500 may cooperate with (or incorporate) one or more of an input database 515 and an output database 595.

As will be discussed in more detail below, the compression unit 520 attempts to compress a test pattern. If the test pattern is uncompressible, the non-shift clock cycle addition unit 540 will add one or more non-shift clock cycles to one or more uncompressible segments in the plurality of segments.

Figure 7:
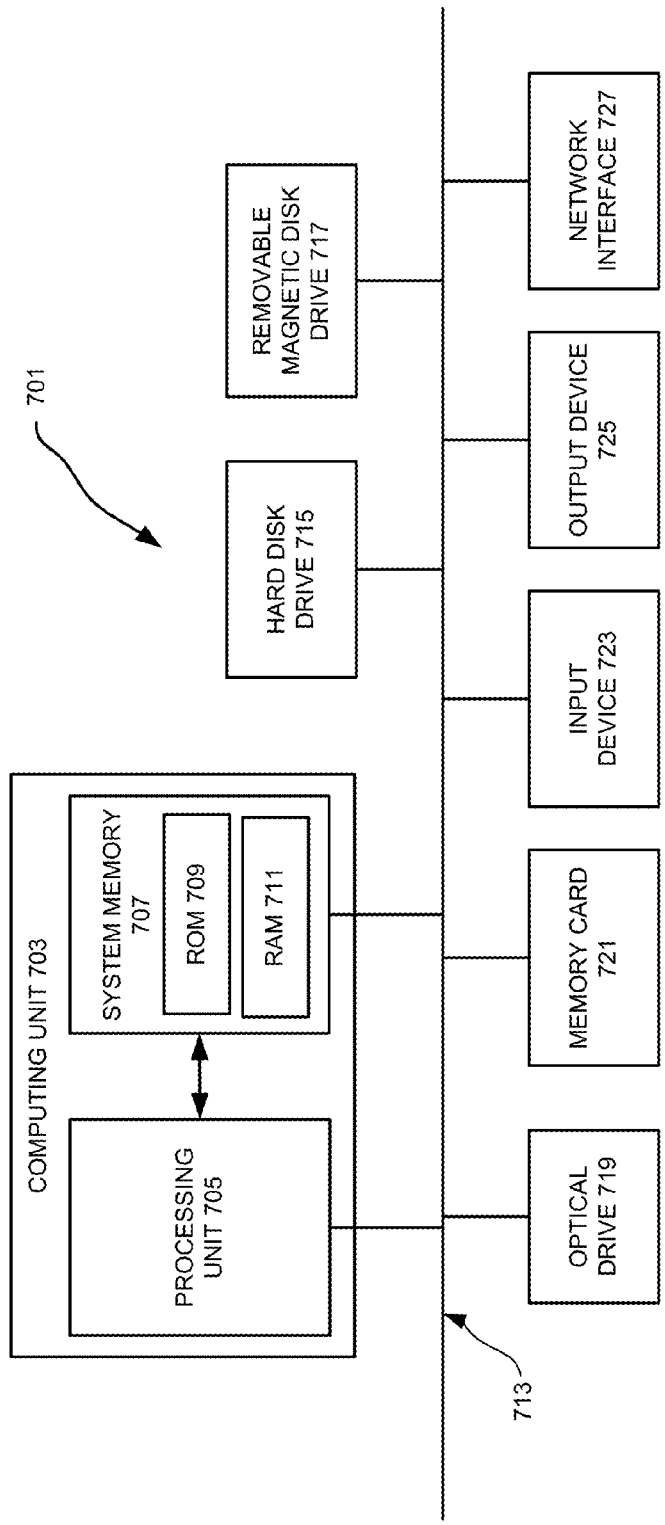
FIG. 7 illustrates a programmable computer system with which various embodiments of the disclosed techniques may be employed.

As previously noted, various examples of the disclosed technology may be implemented by a multiprocessor computing system, such as the computer illustrated in FIG. 7. Details of the computer are discussed below. One or both of the compression unit 520 and the non-shift clock cycle addition unit 540 may be implemented by executing programming instructions on one or more processors in a computer such as the computer illustrated in FIG. 7. Correspondingly, some other embodiments of the disclosed technology may be implemented by software instructions, stored on a non-transitory computer-readable medium, for instructing one or more programmable computers/computer systems to perform the functions of one or both of the compression unit 520 and the non-shift clock cycle addition unit 540. As used herein, the term "non-transitory computer-readable medium" refers to computer-readable medium that are capable of storing data for future retrieval, and not propagating electromagnetic waves. The non-transitory computer-readable medium may be, for example, a magnetic storage device, an optical storage device, a "punched" surface type device, or a solid state storage device.

It also should be appreciated that, while the compression unit 520 and the non-shift clock cycle addition unit 540 are shown as separate units in FIG. 5, a single servant computer (or a single processor within a master computer) may be used to implement both units at different times, or components of two or more of these units at different times.

With various examples of the disclosed technology, the input database 515 and the output database 595 may be implemented using any suitable computer readable storage device. That is, either of the input database 515 and the output database 595 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, holographic storage devices, or any other non-transitory storage medium that can be used to store desired information. While the input database 515 and the output database 595 are shown as separate units in FIG. 5, a single data storage medium may be used to implement some or all of these databases.

FIG. 6 illustrates a flowchart showing a process for generating compressed test patterns based on dynamic shift that may be implemented according to various examples of the disclosed technology. For ease of understanding, methods for generating compressed test patterns based on dynamic shift that may be employed according to various embodiments of the disclosed technology will be described with reference to the compressed test pattern generation tool 500 illustrated in FIG. 5 and the flow chart 600 in FIG. 6. It should be appreciated, however, that alternate implementations of a compressed test pattern generation tool may be used to perform the method for generating compressed test patterns based on dynamic shift shown in the flow chart 600 according to various embodiments of the disclosed technology. In addition, it should be appreciated that implementations of the compressed test pattern generation tool 500 may be employed to implement methods for generating compressed test patterns based on dynamic shift according to different embodiments of the disclosed technology other than the one illustrated by the flow chart 600 in FIG. 6.

Initially, in operation 620 of the flow chart 600, the compression unit 520 determines whether a test pattern is compressible. In the case of EDT, if the set of linear equations associated with the test pattern has a solution, the test pattern is compressible. More specified bits may be added to the test pattern for detecting more faults.

If the test pattern is uncompressible, in operation 640, the non-shift clock cycle addition unit 540 adds one or more non-shift clock cycles to one or more uncompressible segments in a plurality of segments of scan chains. A segment of one scan chain may contain a predetermined number of consecutive scan cells, at least for segments excluding the one at the output end. The one or more segments may be selected from the plurality of segments based on whether a segment is compressible. Alternatively or additionally, the number of specified bits in a segment and/or the location of the segment on the scan chain may serve as selection criteria.

FIGS. 8A-8C shows an example of a detailed implementation of the flow chart 600. In this example, the test generation with dynamic shift is the same as the traditional test generation except the compression check. The procedure TG_with_dynamic_shift( ) shown in FIG. 8A generate tests for a set of target faults. The purpose to order the uncompressible segments in the Step 10 of the procedure compress_test_cube( ) shown in FIG. 8B is to allow the extra free variables added in the segments close to scan outputs to be used by the segments far away from the scan outputs such that it could reduce the number segments identified to have additional cycles. It is worth pointing out that the procedure compress_test_cube( ) does not try all the possibilities of selecting given number of extra segments with additional cycles. It may miss the solution to compress the test cube tc. However, the described heuristic helps to reduce the number of times using solver to check if tc is compressible.

Figure 9:
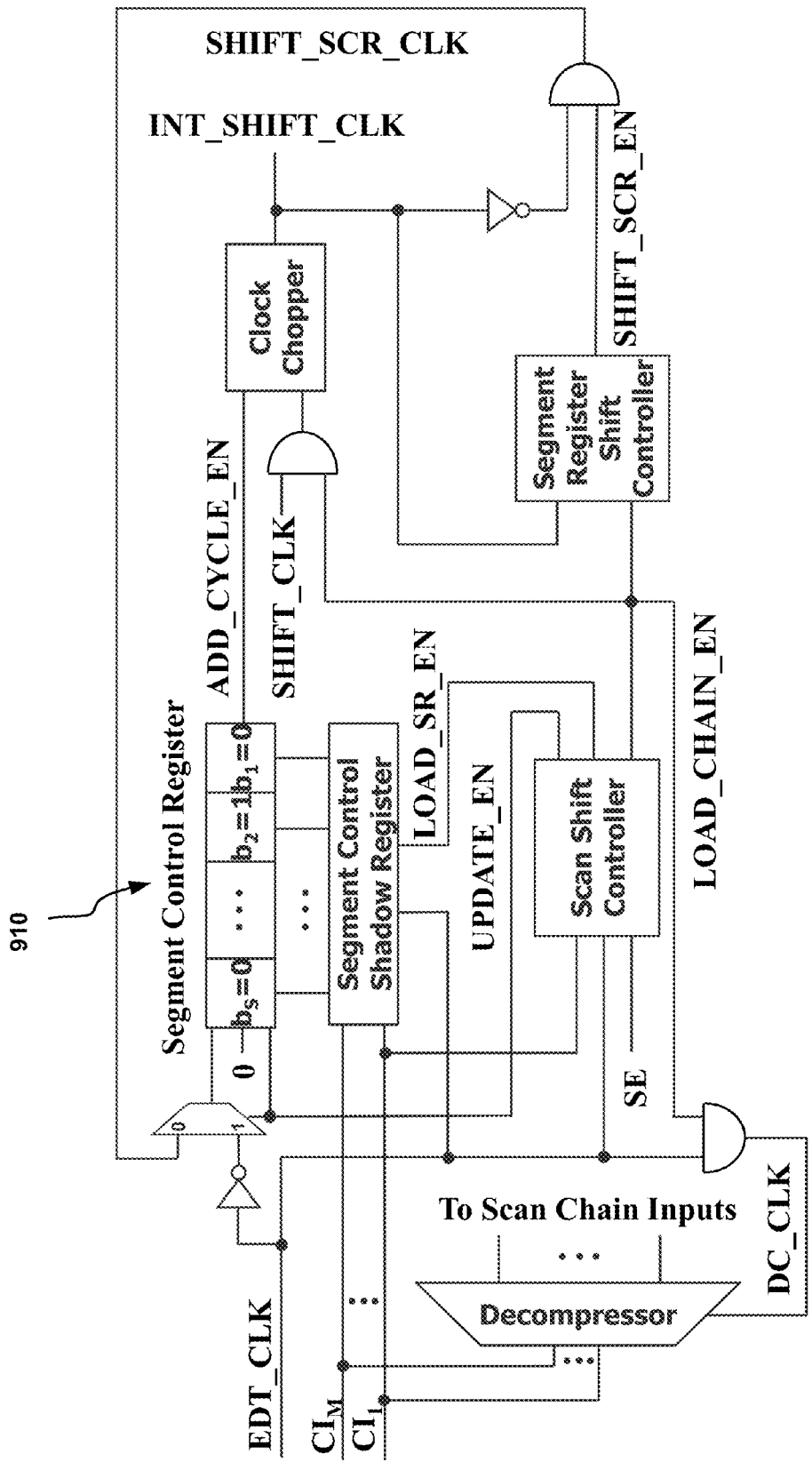
FIG. 9 illustrates an example of a dynamic shift controller for applying test patterns generated based on dynamic shift.
Figure 10:
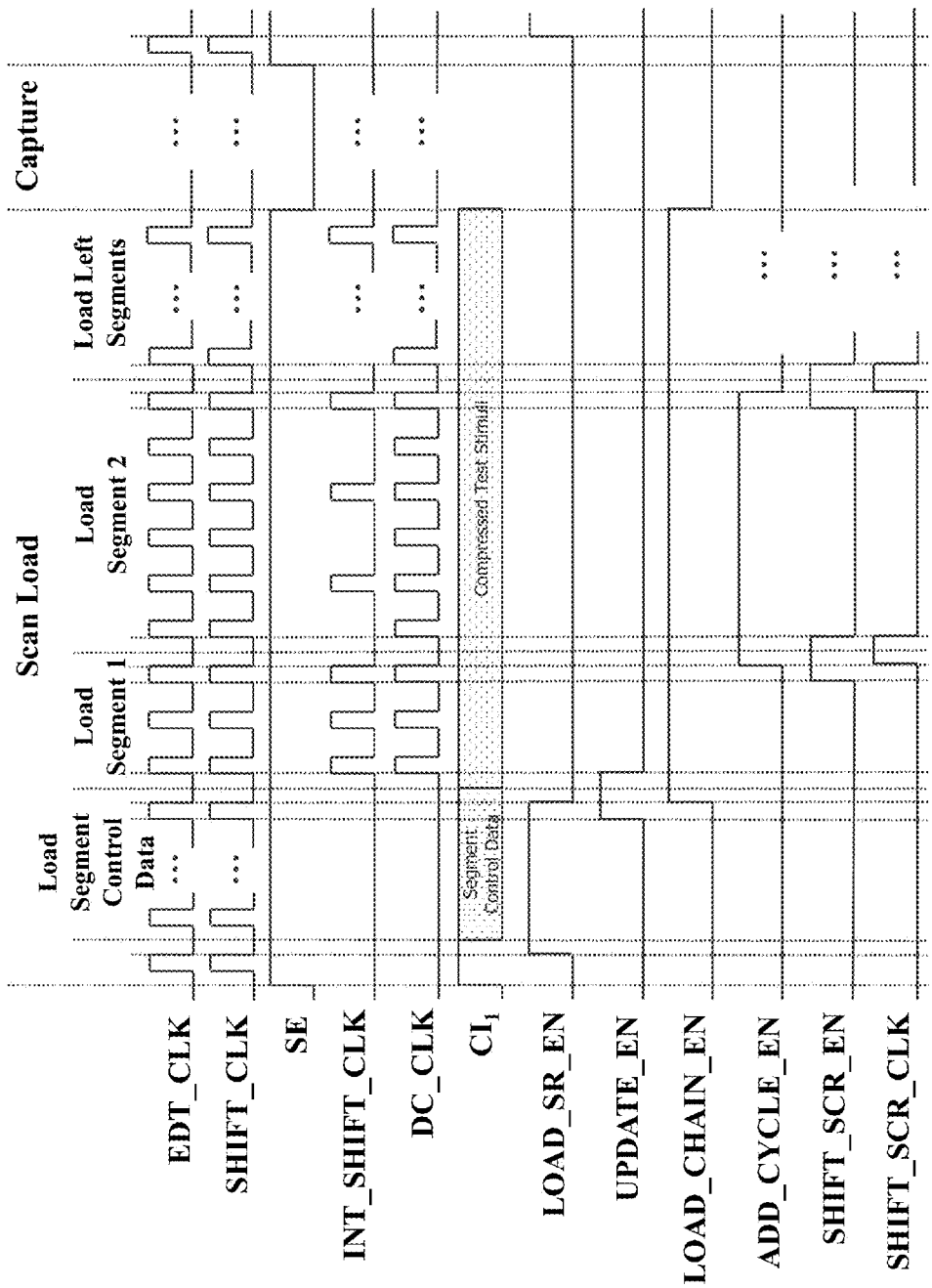
FIG. 10 shows the scan shift waveforms for the example shown in FIG. 9.

FIG. 9 illustrates an example of a dynamic shift controller for applying test patterns generated based on dynamic shift. Scan chains are divided into S segments with equal length. If the last segment of some of the scan chains, i.e., the one close to the scan outputs, is not long enough, additional shift cycles are inserted to make it have the same length as other segments. During shift, each segment is controlled by the segment control data loaded into segment control register 910 and the size of this register is equal to S. When loading control value 0 into $i^{th}$ bit, no additional shift cycle is inserted in the $i^{th}$ segment. When loading control value 1 into $i^{th}$ bit, N additional cycles will be inserted before every shift cycle in the $i^{th}$ segment. The scan chains are shifted by using the clock, INT_SHIFT_CLK, generated internally. The scan shift waveforms for the scan load with dynamic shift are shown in FIG. 10 by assuming each segment has 3 scan slices and 1 additional shift cycle is inserted at the beginning of each shift cycle for the segments with control bit value set to 1.

The segment control register 910 has two types of operations: 1) UPDATE_EN=0: It operates as shift register and the shift clock is driven by SHIFT_SCR_CLK. The left data input of the shift register is driven by value 0 and the output of shift register drives control signal ADD_CYCLE_N directly. ADD_CYCLE_EN=0 means no additional cycle is added in each shift cycle and ADD_CYCLE_EN=1 means N additional cycles are added before each shift cycle. After pulsing SHIFT_SCR_CLK_S times, the register content becomes 0, and 2) UPDATE_EN=1: The data stored in segment control shadow register is transferred to the segment control register in the falling edge of EDT_CLK.

The scan load begins when the scan enable, SE, becomes 1. At this time, all bits in the segment control register 910 have value 0. The dynamic shift controller starts to receive the test stimulus data from M channel inputs, $CI_1$ to $CI_M$. The first value at $CI_1$ determines the scan load modes: 1) $CI_1$=0: None dynamic shift mode. No segment control data will be loaded into the segment control shadow register and UPDATE_EN stays at 0 to disable to transfer data from segment control shadow register to segment control register. At the falling edge of the first EDT_CLK pulse, LOAD_CHAIN_EN becomes 1. It allows pulse decompressor driving clock, DC_CLK, continuously to decompress the test stimuli supplying from the channel inputs. This mode is the same as regular EDT scan load except one additional EDT_CLK cycle is added at the beginning of scan load; and 2) $CI_1$=1: Dynamic shift mode. At the falling edge of the first EDT_CLK pulse, LOAD_SR_EN becomes 1 and it lasts S/M EDT_CLK cycles. In these cycles, the segment control data is loaded into segment control shadow register at the rising edge of EDT_CLK. At the rising edge of the last S/M EDT_CLK cycle, UPDATE_EN becomes 1 and it allows transfer segment control data from segment control shadow register to segment control register at the falling edge of EDT_CLK in the same cycle. Meanwhile, LOAD_SR_EN becomes 0 and LOAD_CHAIN_EN becomes 1 at the same falling edge. In FIG. 6, the first segment control bit $b_1$=0 disables the clock chopper and makes SHIFT_CLK drive INT_SHIFT_CLK directly. The first segment is loaded after 3 SHIFT_CLK cycles as shown in FIG. 10. At the falling edge of last SHIFT_CLK pulse to load segment 1, the segment control register is shifted to right once and $b_2$=1 makes ADD_CYCLE_EN becomes 1. This signal enables the clock chopper to pulse INT_SHIFT_CLK every (N+1) SHIFT_CLK cycles, where N is the number of additional cycles inserted at the beginning of each shift cycle. Note that DC_CLK pulses at every SHIFT_CLK cycle. It allows additional free variables to be pumped into decompressor through channel inputs in order to increase encoding capacity. INT_SHIFT_CLK is also used to drive segment register shift controller as shown in FIG. 6. This controller makes SHIFT_SCR_EN become 1 for every K INT_SHIFT_CLK cycles, where K is number of scan slices in each segment. SHIFT_SCR_EN is used to generate SHIFT_SCR_CLK by gating INT_SHIFT_CLK. In FIG. 7, SHIFT_SCR_CLK is pulsed once after every 3 INT_SHIFT_CLK cycles.

Although the dynamic shift mode may increase the scan shift cycles by N times in the worst case, it increases the encoding capacity without adding more channel inputs. By controlling segments with additional shift cycles, it improves the encoding efficiency such that the test cubes could become compressible with smaller number of channel inputs and more specified bits can be compressed in each test cube.

FIG. 7 shows an illustrative example of such a programmable computer (a computing device 701). As seen in this figure, the computing device 701 includes a computing unit 703 with a processing unit 705 and a system memory 707. The processing unit 705 may be any type of programmable electronic device for executing software instructions, but will conventionally be a microprocessor. The system memory 707 may include both a read-only memory (ROM) 709 and a random access memory (RAM) 711. As will be appreciated by those of ordinary skill in the art, both the read-only memory (ROM) 709 and the random access memory (RAM) 711 may store software instructions for execution by the processing unit 705.

The processing unit 705 and the system memory 707 are connected, either directly or indirectly, through a bus 713 or alternate communication structure, to one or more peripheral devices. For example, the processing unit 705 or the system memory 707 may be directly or indirectly connected to one or more additional memory storage devices, such as a "hard" magnetic disk drive 715, a removable magnetic disk drive 717, an optical disk drive 719, or a flash memory card 721. The processing unit 705 and the system memory 707 also may be directly or indirectly connected to one or more input devices 723 and one or more output devices 725. The input devices 723 may include, for example, a keyboard, a pointing device (such as a mouse, touchpad, stylus, trackball, or joystick), a scanner, a camera, and a microphone. The output devices 725 may include, for example, a monitor display, a printer and speakers. With various examples of the computer 701, one or more of the peripheral devices 715-725 may be internally housed with the computing unit 703. Alternately, one or more of the peripheral devices 715-725 may be external to the housing for the computing unit 703 and connected to the bus 713 through, for example, a Universal Serial Bus (USB) connection.

With some implementations, the computing unit 703 may be directly or indirectly connected to one or more network interfaces 727 for communicating with other devices making up a network. The network interface 727 translates data and control signals from the computing unit 703 into network messages according to one or more communication protocols, such as the transmission control protocol (TCP) and the Internet protocol (IP). Also, the interface 727 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 701 is illustrated as an example only, and it not intended to be limiting. Various embodiments of the disclosed techniques may be implemented using one or more computing devices that include the components of the computer 701 illustrated in FIG. 7, which include only a subset of the components illustrated in FIG. 7, or which include an alternate combination of components, including components that are not shown in FIG. 7. For example, various embodiments of the disclosed techniques may be implemented using a multi-processor computer, a plurality of single and/or multiprocessor computers arranged into a network, or some combination of both.

Some other embodiments of the disclosed techniques may be implemented by software instructions, stored on one or more non-transitory computer-readable media, for causing one or more processors to create a design of the integrated circuit such as the one shown in FIG. 1. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

CONCLUSION

While the disclosed techniques has been described with respect to specific examples including presently preferred modes of carrying out the disclosed techniques, those skilled in the art will appreciate that there are numerous variations and permutations of the above described systems and techniques that fall within the spirit and scope of the disclosed techniques as set forth in the appended claims. For example, while specific terminology has been employed above to refer to electronic design automation processes, it should be appreciated that various examples of the disclosed techniques may be implemented using any desired combination of electronic design automation processes.

What is claimed is:

1. A method, executed by at least one processor of a computer, comprising:
generating compressed test patterns for a design of an integrated circuit, wherein the integrated circuit comprises:
a decompressor configurable to decompress the compressed test patterns,
a compactor configurable to compact test response data, and
scan chains coupled to outputs of the decompressor and to inputs of the compactor, each of scan chains in the circuit design being divided into a plurality of segments, and
wherein the generating comprises:
adding one or more non-shift clock cycles to one or more segments in the plurality of segments to help derive the compressed test patterns, the one or more non-shift clock cycles being additional clock cycles that the decompressor uses to generate bits for scan cells in the one or more segments of the scan chains; and
storing the compressed test patterns and information related to the added one or more non-shift clock cycles.

2. The method recited in claim 1, wherein the one or more segments are selected from the plurality of segments based on whether a segment is compressible.

3. The method recited in claim 2, wherein the adding comprises: determining numbers of specified bits for the plurality of segments, and the selecting of the one or more segments from the plurality of segments is further based on the numbers of specified bits.

4. The method recited in claim 3, wherein the one or more segments are selected from the plurality of segments based further on segment locations on the scan chains.

5. The method recited in claim 1, wherein the decompressor is a linear finite-state machine.

6. The method recited in claim 1, wherein the adding comprises:
determining whether test compression is achievable; and
when the test compression is unachievable, adding a predetermined number of non-shift clock cycles to bits of the test patterns associated with one segment in the plurality of segments.

7. The method recited in claim 6, wherein the adding further comprises:
determining whether the test compression is achievable after the predetermined number of non-shift clock cycles are added to bits of the test patterns associated with the one segment in the plurality of segments; and
when the test compression is unachievable, adding the predetermined number of non-shift clock cycles to bits of the test patterns associated with another segment in the plurality of segments.

8. One or more non-transitory computer-readable media storing computer-executable instructions for causing one or more processors to perform a method, the method comprising:
generating compressed test patterns for a design of an integrated circuit, wherein the integrated circuit comprises:
a decompressor configurable to decompress the compressed test patterns,
a compactor configurable to compact test response data, and
scan chains coupled to outputs of the decompressor and to inputs of the compactor, each of scan chains in the circuit design being divided into a plurality of segments, and
wherein the generating comprises:
adding one or more non-shift clock cycles to one or more segments in the plurality of segments to help derive the compressed test patterns, the one or more non-shift clock cycles being additional clock cycles that the decompressor uses to generate bits for scan cells in the one or more segments of the scan chains; and
storing the compressed test patterns and information related to the added one or more non-shift clock cycles.

9. The one or more non-transitory computer-readable media recited in claim 8, wherein the one or more segments are selected from the plurality of segments based on whether a segment is compressible.

10. The one or more non-transitory computer-readable media recited in claim 9, wherein the adding comprises: determining numbers of specified bits for the plurality of segments, and the selecting of the one or more segments from the plurality of segments is further based on the numbers of specified bits.

11. The one or more non-transitory computer-readable media recited in claim 10, wherein the one or more segments are selected from the plurality of segments based further on segment locations on the scan chains.

12. The one or more non-transitory computer-readable media recited in claim 8, wherein the decompressor is a linear finite-state machine.

13. The one or more non-transitory computer-readable media recited in claim 8, wherein the adding comprises:
determining whether test compression is achievable; and
when the test compression is unachievable, adding a predetermined number of non-shift clock cycles to bits of the test patterns associated with one segment in the plurality of segments.

14. The one or more non-transitory computer-readable media recited in claim 13, wherein the adding further comprises:
determining whether the test compression is achievable after the predetermined number of non-shift clock cycles are added to bits of the test patterns associated with the one segment in the plurality of segments; and
when the test compression is unachievable, adding the predetermined number of non-shift clock cycles to bits of the test patterns associated with another segment in the plurality of segments.

15. An integrated circuit, comprising:
a decompressor configurable to decompress compressed test patterns;
a compactor configurable to compact test response data;
scan chains coupled to outputs of the decompressor and to inputs of the compactor, wherein the scan chains are divided into a plurality of segments; and
circuitry configured to add one or more non-shift clock cycles to one or more segments in the plurality of segments based on non-shift clock control data, wherein the one or more non-shift clock cycles are additional clock cycles the decompressor uses to generate bits for scan cells in the one or more segments of the scan chains.

16. The integrated circuit recited in claim 15, wherein the decompressor is a linear finite-state machine.

* * * * *